(12) United States Patent
Sato et al.

(10) Patent No.: US 8,302,835 B2
(45) Date of Patent: Nov. 6, 2012

(54) POINT FLOW SOLDERING APPARATUS

(75) Inventors: Issaku Sato, Tokyo (JP); Akira Takaguchi, Toyama (JP)

(73) Assignee: Senju Metal Industry Co., Ltd., Tokyo (JP)

(*) Notice: Subject to any disclaimer, the term of this patent is extended or adjusted under 35 U.S.C. 154(b) by 0 days.

(21) Appl. No.: 13/142,419

(22) PCT Filed: Dec. 28, 2009

(86) PCT No.: PCT/JP2009/007365
§ 371 (c)(1),
(2), (4) Date: Jun. 27, 2011

(87) PCT Pub. No.: WO2010/073739
PCT Pub. Date: Jul. 1, 2010

(65) Prior Publication Data
US 2011/0284619 A1 Nov. 24, 2011

(30) Foreign Application Priority Data
Dec. 27, 2008 (JP) ................. 2008-335490

(51) Int. Cl.
*B23K 1/08* (2006.01)
(52) U.S. Cl. ............. 228/37; 228/33; 228/36; 228/256; 228/260
(58) Field of Classification Search ............ 228/33, 228/36, 37, 256, 260
See application file for complete search history.

(56) References Cited

U.S. PATENT DOCUMENTS
4,779,790 A * 10/1988 Wallgren et al. ........... 228/180.1
7,032,803 B2 * 4/2006 Matsuura et al. ................ 228/37
(Continued)

FOREIGN PATENT DOCUMENTS
JP 1994000561 1/1994
(Continued)

OTHER PUBLICATIONS
International Search Report for PCT/JP2009/007365, Jan. 19, 2010.
(Continued)

*Primary Examiner* — Devang R Patel
(74) *Attorney, Agent, or Firm* — Chernoff Vilhauer McClung & Stenzel, LLP (57) ABSTRACT

To prevent clogging in a jet nozzle without using any inert gas and to allow reliability to be improved by filling a through hole of a printed circuit board with the molten solder.
By flowing the molten solder 4 in the solder bath 2 from inside of the inner cylinder 15 to a nozzle cap 19, the inside of the nozzle cap 19 is filled with the molten solder 4, and the molten solder 4 filling the inside of the nozzle cap 19 is flown downward from between an inner cylinder 15 and an outer cylinder 16 without substantially flowing it to outside from an insert hole 19a. This enables the molten solder 4 to be prevented from oxidizing because the molten solder 4 is not exposed to the outside air. For this reason, it is possible to prevent clogging in the jet nozzle 3 without filling a part of nozzle outlet with any inert gas as in the conventional soldering apparatus. Further, since the soldering is performed with a lead 31 of electronic component 30 being inserted into the insert hole 19a, it is possible to fill the through hole of the printed circuit board P with the molten solder 4, so that the reliability can be improved.

5 Claims, 4 Drawing Sheets

U.S. PATENT DOCUMENTS

2009/0224028 A1* 9/2009 Ciniglio et al. ............... 228/219

FOREIGN PATENT DOCUMENTS

| JP | 06188552 A | * | 7/1994 |
| JP | 6188552 A | | 7/1994 |
| JP | 1126926 A | | 1/1999 |
| JP | 2003251456 A | | 9/2003 |
| JP | 2004296889 A | | 10/2004 |
| JP | 2006114556 A | | 4/2006 |
| JP | 2008109034 | | 5/2008 |
| WO | 2007138310 | | 12/2007 |
| WO | WO 2007138310 A2 | * | 12/2007 |

OTHER PUBLICATIONS

Extended European Search Report for PCT/JP2009/007365, search completed May 9, 2012 and mailed Jun. 15, 2012, European Patent Office, Munich, Germany, 7 pages.

* cited by examiner

POINT FLOW SOLDERING APPARATUS

This is a national stage application filed under 35 USC 371 based on International Application No. PCT/JP2009/007365 filed Dec. 28, 2009, and claims priority under 35 USC 119 of Japanese Patent Application No. JP 2008-335490, filed Dec. 27, 2008.

TECHNICAL FIELD

The present invention relates to a point flow soldering apparatus that solders a lead of electronic component instead of a soldering iron.

BACKGROUND ART

The soldering of printed circuit board has been often performed in recent years by a flow soldering. For the flow soldering, an automatic soldering apparatus has been utilized. This automatic soldering apparatus flows molten solder out of a solder bath containing the molten solder through a jet nozzle to solder the printed circuit board. The reasons for soldering the printed circuit board by the flow soldering are that costs in equipment is relatively small even in addition of any peripheral equipment, that this has a high reliability of soldering, and that any components therefor are easily available because the components with leads can be easily manufactured and the like, so that the flow soldering has occupied a major position in the soldering method.

Since, in recent years, requirement for small sized electronic components has been increasing based on popularization of cellular phone or the like, the soldering method is shifted to a reflow soldering which is suitable for soldering the small sized surface mount device. The reflow soldering method is performed so that solder paste and solder ball are formed on a printed circuit board at predetermined positions (electrodes and the like) and the surface mount devices and the like are mounted on the printed circuit board. The soldering is performed by passing such a printed circuit board through a reflow furnace heated at temperature of 220° C. through 250° C. during more than one minute. For this reason, the surface mount device to be soldered on the printed circuit board by the reflow soldering requires a heat-resistant property compared with conventional electronic components by the flow soldering. In recent years, in order to make provision for environmental affairs, the solder used for the flow or reflow soldering has been replaced lead-free solder, melding temperature of which is about 220° C., such as Sn-3.0Ag-0.5Cu with conventional Sn—Pb solder, melding temperature of which is 183° C., which requires any electronic components having a higher heat-resistant property.

Thus, although the soldering method has been shifted from the flow soldering to the reflow soldering and the solder has been replaced the lead-free solder with Sn—Pb solder, most of the electronic components, which has not any heat-resistant property that is required for the reflow soldering and the lead-free solder, for example, such as a precision semiconductor like MPU or the like, connection components, an exterior of which is made of resin, like a connector, a switch or the like, an aluminum electrolytic capacitor which contains electrolyte therein, and the like has been even now retrofitted by manual soldering in which a worker does it using a soldering iron or the like.

Any correction operations of the flow soldering and the reflow soldering by manual soldering by the soldering iron using rosin-core solder are decreased as a result of development of a high performance soldering apparatus based on the advance of technology on the flow soldering and the reflow soldering, but are also often used even now. This manual soldering, however, has reduced an efficiency of work because a person does so and has been subject to a variation of quality because the quality of solder varies based on experience and skill in a worker and it is not easy to train a worker for an experienced and skillful one.

As automation of the manual soldering, a soldering robot or the like has been developed. This, however, has merely replaced the soldering robot with a worker who does the manual soldering by the soldering iron, the soldering robot increasing an efficiency of work but decreasing the efficiency of work compared with the flow or reflow soldering, and too many soldering robots are required for soldering a lot of printed circuit boards, which causes the costs to be increased. Further, a soldering apparatus that applies heat by laser, light beam or the like instead of an application of heat by the soldering iron of the soldering robot has been developed but heat must be rapidly applied to increase the efficiency of work, in which flux contained in the rosin-core solder is subject to any spatter, thereby simply causing poor functioning such as poor conduction, poor insulation or the like.

An invention relating to a point flow soldering apparatus which is replaced with the manual soldering using the soldering iron is disclosed in each of the patent documents 1 and 2. Both of the point flow soldering apparatuses are ones which always flows out a small amount of molten solder to an outside through a small sized nozzle outlet of the jet nozzle for point flow and collects the molten solder thus flown from an outlet arranged around the jet nozzle. Such point flow soldering apparatuses have a problem such that an amount of the solder flown to the outside is small so that the solder is subject to oxidation and oxide generated in the molten solder which has been flown to the outside becomes hard in the small sized nozzle outlet of the jet nozzle so as to be easily stuffed therein.

Accordingly, in the patent document 1, a soldering apparatus has been disclosed in which a periphery of the jet nozzle is set so as to be in an atmosphere of nitrogen, a cover for restraining the molten solder from being oxidized is positioned around the jet nozzle and a spiral pathway is provided between the cover and the jet nozzle. Specifically, this point flow soldering apparatus has a configuration such that the spiral pathway is formed outside the jet nozzle, the jet nozzle is enclosed by a jacket which is able to provide the atmosphere of nitrogen and a whole space between the jet nozzle and the jacket is filled with the nitrogen in order to restrain the molten solder flown out of the jet nozzle from becoming oxide within the spiral pathway and becoming hard.

On the other hand, in the patent document 2, a soldering apparatus has been disclosed in which a cover for allowing a periphery of the jet nozzle to be in an atmosphere of nitrogen is arranged around the jet nozzle and the solder flown out of the jet nozzle is passed between the cover and the jet nozzle. Specifically, a solder collection portion is provided at a forward end of the jet nozzle, the solder collection portion being wider than a solder pathway and being provided at the forward end of the jet nozzle, and a set amount of the solder collected in the solder collection portion is spouted by a gear pump. For this soldering apparatus, it is necessary to put the nozzle outlet of the jet nozzle in an inert atmosphere of nitrogen or the like because a small amount of molten solder spatters and is subject to oxidation.

Thus, the patent documents 1 and 2 both relate to prevention of oxidation of the molten solder flown from the jet nozzle to outside by providing a cover around the outlet of the jet nozzle and filling the periphery of the jet nozzle with an inert gas such as nitrogen gas to intercept oxygen.

PRIOR ART DOCUMENTS

Patent Document

Patent Document 1: WO 2007/138310 A2; and
Patent Document 2: Japanese Patent Application Publication No. 2008-109034.

DISCLOSURE OF THE INVENTION

Problems to be Solved by the Invention

The point flow soldering apparatuses disclosed in the patent documents 1 and 2 always flow out the molten solder from the small sized nozzle outlet but since a spot to be soldered is fine, the solder is subject to oxidation so that unless it is in an inert atmosphere of nitrogen or the like, the molten solder flown from the nozzle outlet is easily oxidized, which is always required to use inert gas of nitrogen or the like.

Supply of the inert gas of nitrogen or the like causes installation costs or running costs to be increased even when supplying it from a nitrogen-generating apparatus or a tank or bomb, and it is required to secure a wide installation space. Since the point flow soldering apparatus is usually used as replacement with the manual soldering using a soldering iron, many enterprises for manual soldering cannot often install any point flow soldering apparatus because of the installation space and/or the installation costs.

Further, each of the point flow soldering apparatuses disclosed in the patent documents 1 and 2 inserts a lead of the electronic component into a through hole of the printed circuit board and applies the molten solder flown from the nozzle outlet to a spot to be soldered to solder it. When doing such soldering with lead-free solder, it cannot fill the through hole with the molten solder perfectly, which results in poor reliability.

The invention, then, solves such problems which the conventional technology has, and provides a point flow soldering apparatus which, even if the point flow soldering apparatus is replaced with the manual soldering, can prevent clogging from occurring in the jet nozzle without using any inert gas of nitrogen or the like, and can improve the reliability by filling the through hole of the printed circuit board with the molten solder.

Means for Solving the Problems

Inventors have kept reviewing the above-mentioned problems diligently in order to solve them, so that they have found out that, by configuring such that the molten solder is prohibited from flowing out the molten solder to an outside of the jet nozzle of the point flow soldering apparatus, oxidation of the molten solder is also restrained so that a stable point soldering can be performed unless a part of the nozzle outlet is in an inert atmosphere of nitrogen or the like and the through hole of the printed circuit board is filled with the molten solder, and have completed this invention.

In order to solve the above-mentioned problems, a point flow soldering apparatus according to the invention is a point flow soldering apparatus for soldering lead of electronic component, the apparatus comprising a solder bath, and a jet nozzle which flows out the solder contained in the solder bath upward, the electronic component being positioned over the jet nozzle so as to be away from it by a predetermined distance, characterized in that the jet nozzle contains an outer cylinder which has openings at an end and the other end thereof along an axial direction, the opening at the end thereof being positioned inside the solder bath, the opening at the other end thereof being positioned outside the solder bath, an inner cylinder which is installed inside the outer cylinder and has openings at an end and the other end thereof along the axial direction, the opening at the end thereof being positioned inside the solder bath, the opening at the other end thereof being positioned outside the solder bath, and a nozzle cap which has an insert hole for allowing the lead to be inserted and covers the openings at the other ends of the inner and outer cylinders, wherein the solder contained in the solder bath is flown from inside of the inner cylinder to the nozzle cap to fill the nozzle cap with the solder up to the top of the insert hole, the solder filling the nozzle cap up to the top of the insert hole solders the lead inserted into the insert hole, and the solder is then flown downward from between the inner and outer cylinders.

The point flow soldering apparatus according to the invention is also characterized in that a distance between an inner side surface of the outer cylinder and an outer side surface of the inner cylinder is 1.2 times not less than and 5 times not more than a distance between a forward end of the nozzle cap and the electronic component to be soldered.

In the point flow soldering apparatus according to the invention, it is desirable that a distance between an inner side surface of the outer cylinder and an outer side surface of the inner cylinder is not less than 0.1 mm and not more than 2.0 mm. Further, in the point flow soldering apparatus according to the invention, it is desirable to provide a screw pump, which dispatches the solder, in the solder bath.

The point flow soldering apparatus according to the invention has a configuration such that the molten solder dispatched from the inner cylinder, which is a pathway of the solder, installed inside the jet nozzle is flown inside the nozzle cap without substantially flowing it to outside from the insert hole of the nozzle cap installed on the forward end of the jet nozzle, is passed between a nozzle main body and the outer cylinder and collected, and is flown back to the solder bath through a hole provided at a lower portion of the outer cylinder. Namely, it has a configuration such that the molten solder is circulated inside the jet nozzle in that it is flows into inside of the cylinder and is again dispatched from the cylinder. Thus, in the invention, the molten solder dispatched from the cylinder is flown inside the nozzle cap without substantially flowing it to outside from the insert hole of the nozzle cap installed on the forward end of the jet nozzle, so that the distance between the inner side surface of the outer cylinder and the outer side surface of the inner cylinder is 1.2 times not less than and 5 times not more than the distance between the forward end of the nozzle cap and the electronic component to be soldered.

By the point flow soldering apparatus according to the invention, the molten solder is exposed to the air via only a part of the insert hole in the nozzle cap without substantially flowing it to outside from the insert hole, which results in that oxide does not occur hardly to forbid clogging to occur in the jet nozzle. Further, since the soldering is performed with the lead being inserted into the insert hole, the through hole of the printed circuit board is filled with the molten solder.

Terms of this invention, "without substantially flowing the molten solder to outside from the insert hole" refer to as "the molten solder is flown out from the nozzle cap merely by volume of the lead when soldering is performed with the lead being inserted into the nozzle cap, but the molten solder is not flown out from the nozzle cap on a stand-by period of time when no soldering is performed."

Oxide occurred in the part of the insert portion provided on the nozzle cap is flown out when inserting the lead of discrete component into the insert hole of the nozzle cap by pushing out the molten solder contained in the jet nozzle according to Archimedean principle, so that clean solder inside the jet nozzle can be attached to the printed circuit board.

Effects of the Invention

By the point flow soldering apparatus according to the present invention, it is possible to prevent the molten solder from being oxidized based on exposure to the air because the molten solder is not substantially flown to outside from the insert hole when operating and flown to outside of the nozzle. For this reason, it is not necessary to fill the part of the nozzle outlet with any inert gas of nitrogen or the like in order to prevent the molten solder from exposing the air and it is possible to keep the point soldering stably because no clogging occur in the jet nozzle. Further, since the through hole of the printed circuit board can be filled with the molten solder, it is capable of improving reliability as compared with the conventional apparatus.

BEST MODE FOR CARRYING OUT THE INVENTION

The following will describe the best mode for carrying out a point flow soldering apparatus according to the present invention with reference to drawings. It is to be noted that in FIG. 1, in order to allow a principle portion of the point flow soldering apparatus to be easily understood, only two of four legs constituting a platform 6 will be shown and remained two legs will be omitted, the molten solder 4 will be also omitted and a half of a cylindrical case extending from a duct 5 provided around spiral blades 7a is cut along a direction of rotation axis 7b.

<Configuration Example of Point Flow Soldering Apparatus 1>

Figure 1:
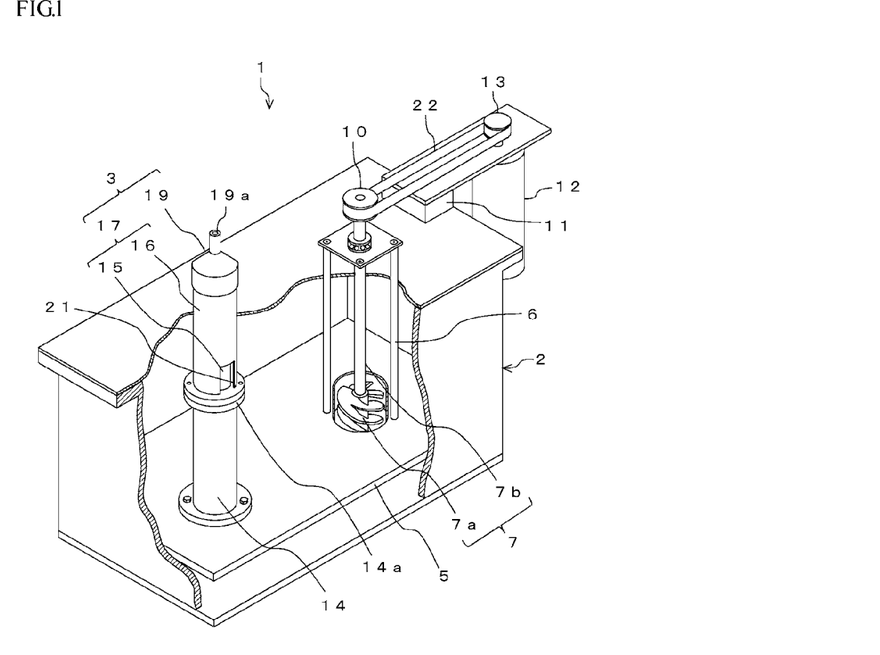
[FIG. 1] is a partially sectional and perspective view of a point flow soldering apparatus 1 according to the invention for showing a configuration example thereof.
Figure 2:
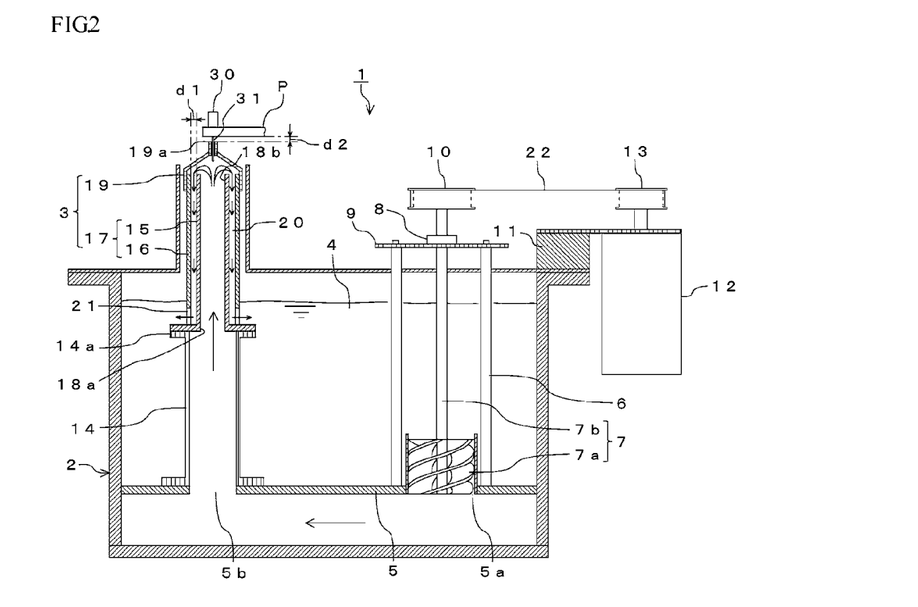
[FIG. 2] is a sectional and front view of the point flow soldering apparatus 1 for showing a configuration example thereof.

As shown in FIGS. 1 and 2, the point flow soldering apparatus 1 is constituted of a solder bath 2 and a jet nozzle 3. The point flow soldering apparatus 1 is an apparatus for soldering a lead 31 of an electronic component 30 as discrete component, which is mounted on a printed circuit board P.

The solder bath 2 contains the molten solder 4. On a bottom of the inside of the solder bath 2, a duct 5 which is a pathway for supplying the molten solder 4 to the jet nozzle 3 is arranged.

The platform 6 is mounted on the duct 5 and at a middle of the inside of the platform 6, a screw pump 7 having a rotation axis 7b and four spiral blades 7a provided on an outer circumference of the forward end of the rotation axis 7b is arranged. The four spiral blades 7a are positioned so as to face inside of the duct 5 through an opening 5a formed in a top surface of the duct 5.

The screw pump 7 is rotatably supported by a bearing 8 which is supported by a bearing-supporting member 9 which is fixed to a top of the solder bath 2. A pulley 10 is also fixed to a top of the rotation axis 7b of the screw pump 7. A supporting member 11 is mounted on a side of the top of the solder bath 2 and a motor 12 is supported by the supporting member 11. A pulley 13 is fixed to an output axis of the motor 12.

An annular belt 22 is run between the pulleys 10 and 13 and when rotating the output axis of the motor 12, the rotation axis 7b of the screw pump 7 also rotates through the pulley 13, the belt 22 and the pulley 10 and the spiral blades 7a rotate.

As solder-dispatching mechanism in the point flow soldering apparatus 1, it is desirable to use the screw pump 7. By an impeller pump using as solder-dispatching mechanism of a general automatic soldering apparatus, solder stream accelerated by the impeller directly affects the insert hole 19a of a nozzle cap 19 of the jet nozzle 3 so that it flows out to outside through the insert hole 19a of the nozzle cap 19.

On the other hand, when using the screw pump 7, it can dispatch the solder slowly and gently so that it is easy to pressurize the solder, not to stream the solder, and to keep it to a set height. Since the pressure is equally applied onto a surface of the solder, even if a speed of rotation of the screw pump 7 varies based on a variation of voltages applied to the motor 12, the solder is prevented from being flown out of the insert hole 19a of the nozzle cap 19 so that it is possible to keep a height of the solder flow stably. Further, a speed of rotation of the screw pump 7 is smoothly added to the pressure of the solder so that it is possible to adjust the height of the solder accurately in a moment.

Further, a cylinder 14 consisting of hollow cylinder is mounted on the top of the duct 5. It is configured that inner space of the cylinder 14 and inner space of the duct 5 are communicated to each other through an opening 5b formed in the top of the duct 5.

A flange 14a extending outward is annularly formed on an upper end surface of the cylinder 14 and the jet nozzle 3 is provided and fixed to a top of the flange 14a extending outward by suitable means such as coupling means.

<Configuration of Jet Nozzle>

Figure 3:
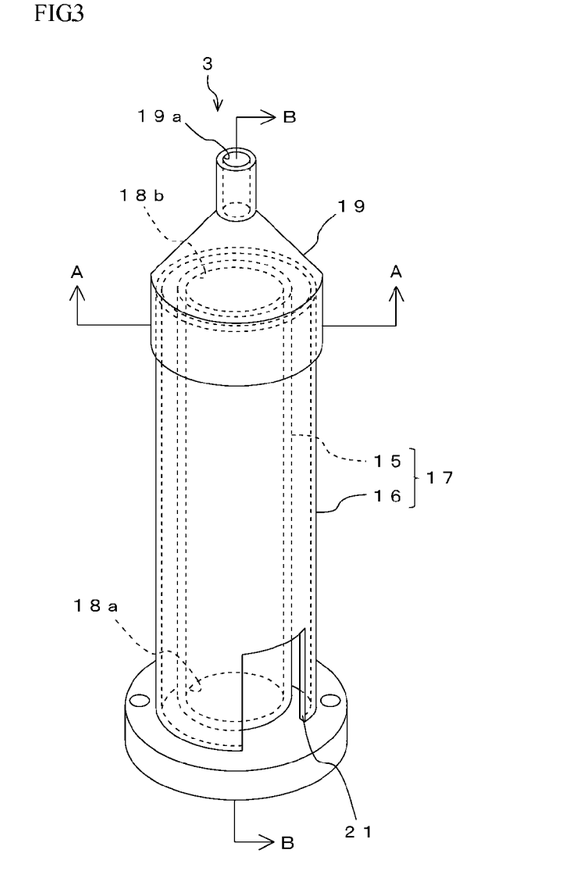
[FIG. 3] is a perspective view of the jet nozzle 3 for showing a configuration example thereof.
Figure 4:
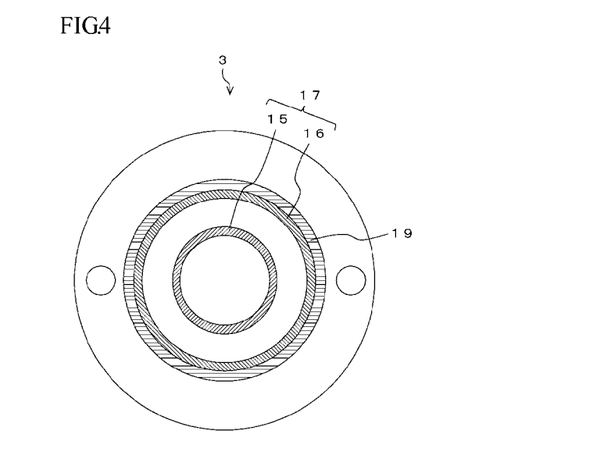
[FIG. 4] is a sectional view of the jet nozzle 3 for showing a configuration example thereof, taken along lines A-A shown in FIG. 3.
Figure 5:
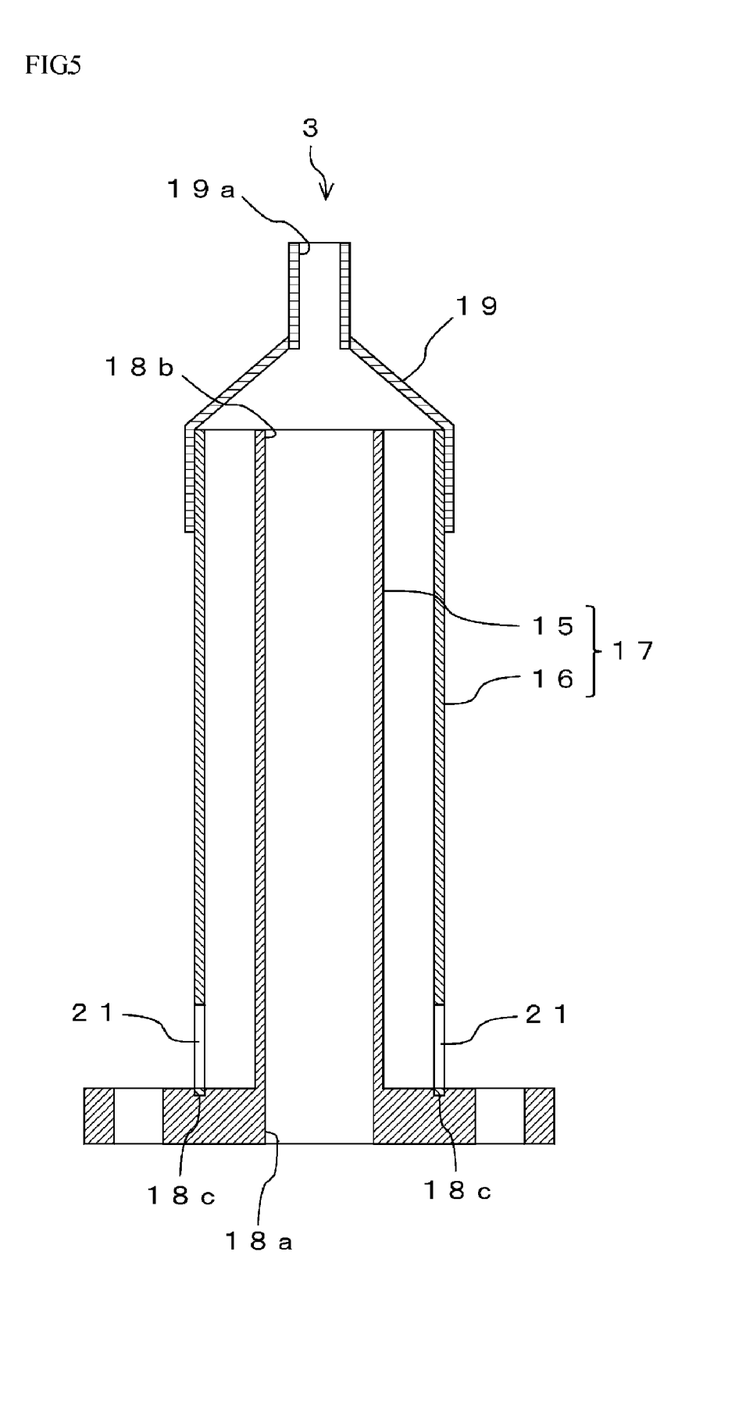
[FIG. 5] is a sectional view of the jet nozzle 3 for showing a configuration example thereof, taken along lines B-B, shown in FIG. 3.

The following will describe the jet nozzle 3 in detail. As shown in FIGS. 3 through 5, the jet nozzle 3 comprises a nozzle bottom portion 17 composed of double cylinders of the inner cylinder 15 and the outer cylinder 16 and the nozzle cap 19. The jet nozzle 3 is one for flowing out the solder 4 contained in the solder bath 2 upward.

The outer cylinder 16 has openings at an end and the other end thereof along an axial direction, the opening at the end thereof is positioned so as to face the inside of the solder bath 2, and the opening at the other end thereof is positioned outside the solder bath. The inner cylinder 15 is installed inside the outer cylinder 16 and in parallel with it and has opening 18a at an end thereof along the axial direction and opening 18b at the other end thereof along the axial direction, the opening 18a at the end thereof is positioned so as to face the inside of the solder bath 2, the opening 18b at the other end thereof is positioned outside the solder bath 2.

A groove 18c is provided in the flange which is provided on a lower portion of the inner cylinder 15 (see FIG. 5). The groove 18c is one for allowing a lower portion of the outer cylinder 16 to be fitted thereto so that the inner cylinder 15 can be fixed to the outer cylinder 16. This enables the inner cylinder 15 and the outer cylinder 16 to be prevented from being slipped out of a set place.

The nozzle cap 19 has an insert hole 19a for allowing the lead 31 provided on the electronic component 30 (see FIG. 2) to be inserted, covers the opening at the other end of the outer cylinder 16 and the opening at the other end of the inner cylinder 15, and is fitted on an outer surface of the nozzle bottom portion 17 and installed to it. The nozzle cap also has the small sized insert hole 19a for allowing to be inserted therein the lead of the electronic component 30 which is transferred over the jet nozzle 3 with it being away therefrom by a predetermined distance.

It is to be noted that although the nozzle cap 19 has been composed of two pieces (separately) in FIG. 5, it may be composed of one piece. When the nozzle cap 19 is composed of separate pieces, it is possible to omit any removing operation of clogged material in the insert hole 19a by exchanging a piece having the insert hole 19a.

The jet nozzle 3 thus configured flows the molten solder 4 contained in the solder bath 2 from inside of the inner cylinder 15 to the nozzle cap 19 to fill the nozzle cap 19 with the molten solder 4, solders the lead 31 of the electronic component 30, which is inserted into the insert hole 19a, with the molten solder 4 with which the inside of the nozzle cap 19 is filled, and then flows it downward from between the inner cylinder 15 and the outer cylinder 16.

Namely, it has a configuration such that the molten solder 4 dispatched from the inner cylinder 15, which is a pathway of the solder, installed inside the jet nozzle 3 flows inside the nozzle cap 19 without substantially flowing it to outside from the insert hole 19a of the nozzle cap 19 installed on the forward end of the jet nozzle 3, passes between the inner cylinder 15 and the outer cylinder 16, and is flown back to the solder bath 2 through an outlet 21 provided at a lower portion of the outer cylinder 16.

For this reason, the molten solder 4 is exposed to the outside air via only a part of the insert hole 19a in the nozzle cap 19 without substantially flowing it to outside from the insert hole 19a, which results in that oxide does not occur hardly to forbid clogging to occur in the jet nozzle. Oxide occurred in the part of the insert portion 19a is flown out when inserting the lead 31 of the electronic component 30 into the insert hole 19a by pushing out the molten solder 4 contained in the jet nozzle 3 according to Archimedean principle, so that clean solder inside the jet nozzle 3 can be attached to the printed circuit board or the like.

In the point flow soldering apparatus 1 according to the invention, as shown in FIG. 2, the distance d1 of space 20 between the inner side surface of the outer cylinder 16 and the outer side surface of the inner cylinder 15 is 1.2 times not less than and 5 times not more than the distance d2 between the forward end of the nozzle cap 19 and the electronic component 30 to be soldered.

The space 20 is a pathway which is used when the molten solder 4 which is pressurized and sent to the nozzle cap 19 through the cylinder 14 is again circulated to the solder bath 2 and thus, the inner cylinder 15 is always contacted to the molten solder 4 so that the molten solder 4 flown to this space 20 is not cooled and hardened.

When the distance d1 is 1.2 times less than the distance d2, it is easy to generate any clogging because the space 20 is too narrow. On the other hand, when the distance d1 is 5 times more than the distance d2, it is impossible to keep a height of the flow inside the jet nozzle 3 because the space 20 is too broad. Further, from the same point of view, it is preferable that the distance d1 is 1.2 times not less than and 2 times not more than the distance d2.

When saying this in different words using real sizes, the distance d2 is about 0.1 mm through 1.8 mm. Therefore, it is preferable that the distance d1 is about 0.1 mm through 3.6 mm. This allows the molten solder 4 supplied through the cylinder 14 to be circulated by flowing it inside the jet nozzle 3 without flowing it to outside from the insert hole 19a of the nozzle cap 19, collecting it to the inside of the solder bath 2 via the outlet 21 provided on the lower portion of the outer cylinder 16 and sending the molten solder 4 thus collected by the screw pump 7 to the jet nozzle 3 again via the duct 5 and the cylinder 14.

It is to be noted that the outlet 21 provided on the lower portion of the outer cylinder 16 is one for discharging the molten solder 4 thus circulated via the above-mentioned space 20 to the inside of the solder bath 2. The outlet 21 is formed in the lower portion of the outer cylinder 16 by making a perforation using any suitable means such as a drill and/or press.

It is preferable that a diameter of the outlet 21 has a size that is one third through one fourth of an outer diameter of the outer cylinder 16. When the diameter of the outlet 21 is less than one fourth thereof, the speed of the molten solder 4 running through the above-mentioned space 20 is decreased so that it is easy to be clogged in the space 20 and it is easy to flow the molten solder 4 out of the insert hole 19a of the nozzle cap 19. Further, when the diameter of the outlet 21 is more than one third thereof, a flow rate of the molten solder 4 discharging via the space 20 is too increased so that a height of flow of the molten solder 4 becomes unstable.

<Operation Example of Point Flow Soldering Apparatus 1>

Figure 6:
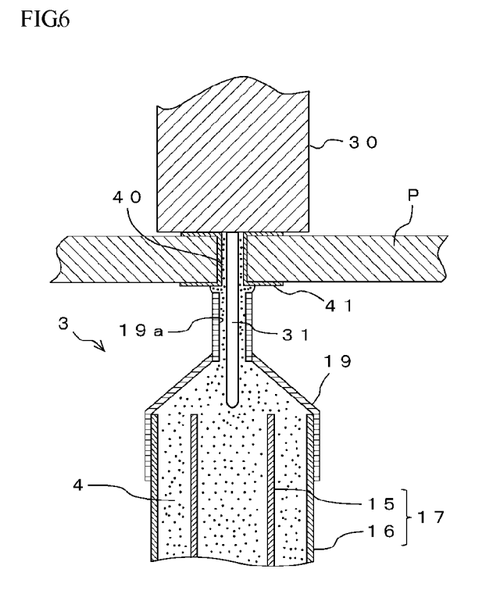
[FIG. 6] is a sectional and front view of the point flow soldering apparatus 1 for showing the operation example (part one) thereof.

Next, the following will describe an operation example of the point flow soldering apparatus 1. As shown in FIG. 6, on the assumption that the jet nozzle 3 is filled with the molten solder 4 (for example, up to the top of the insert hole 19a), the lead 31 of the electronic component 30 is transferred over the jet nozzle 3 by a printed-circuit-board-transferring mechanism, not shown, with it passing through the through hole 40 provided in the printed circuit board P and the lead 31 is inserted into the insert hole 19a.

By the way, a land 41 is formed about the through hole 40. Further, the lead 31 has not been cut into a set length. When soldering the lead 31 which is not cut (or soldering the lead 31, a length of which is long, with it leaving as it stands), it is capable of gaining thermal capacity by a length of the lead, whereby the soldering becomes good.

When the lead 31 is inserted into the insert hole 19a, the molten solder 4 inside the jet nozzle 3 is pushed out by an amount thereof corresponding to a volume of the lead 31 according to Archimedean principle, so that it is flown out of the insert hole 19a. The molten solder 4 flown out of the insert hole 19a contains one which is flown to outside of the jet nozzle 3 and one which is flown up by capillarity along the lead 31.

The molten solder 4 is flown from the insert hole 19a by driving the screw pump 7 while inserting the lead 31 into the insert hole 19a, and the molten solder 4 is put into the through hole 40. This enables the through hole 40 to be perfectly filled with the molten solder 4.

Figure 7:
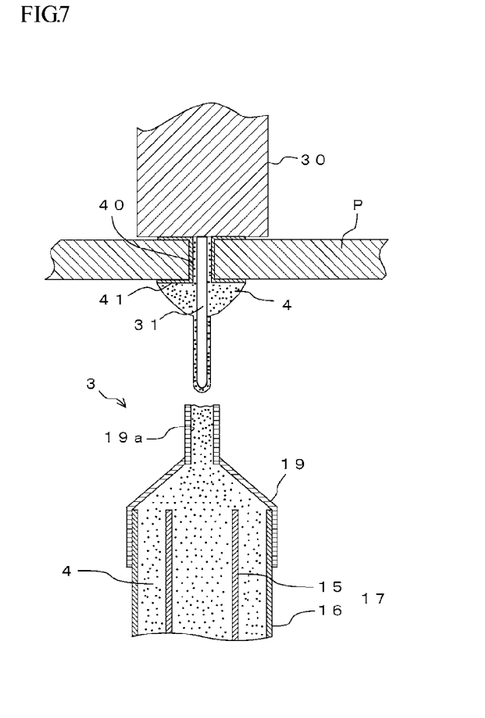
[FIG. 7] is a sectional and front view of the point flow soldering apparatus 1 for showing the operation example (part two) thereof.

As shown in FIG. 7, by lifting the printed circuit board P by the printed-circuit-board-transferring mechanism, the printed circuit board P and the jet nozzle 3 are made away from each other. The through hole 40 is then filled with the molten solder 4 completely and the molten solder 4 is applied to the land 41 so that the soldering is performed. Subsequently, by cutting the lead 31 into a set length thereof, the soldering of the electronic component 30 is completed.

Thus, by the point flow soldering apparatus 1 according to the invention, the molten solder 4 contained in the solder bath 2 is flown from the inside of the inner cylinder 15 to the nozzle cap 19, the inside of the nozzle cap 19 is filled with the molten solder 4, the molten solder 4 with which the inside of the nozzle cap 19 is filled is flown downward from between the outer cylinder 16 and the inner cylinder 15 without substantially flowing it to outside from the insert hole 19a. This enables the molten solder 4 to be prevented from being flown to outside from the jet nozzle 3. Further, since the lead 31 of the electronic component 30 is soldered with it being inserted into the insert hole 19a, it is possible to fill the through hole 40 of the printed circuit board P with the molten solder 4.

As a result thereof, since the molten solder 4 is not flown to outside of the jet nozzle 3 when operating the point flow soldering apparatus 1, it is possible to prevent the molten solder 4 from being oxidized by exposing it to the air. Thus, it is unnecessary to fill the part of nozzle outlet with an inert gas of nitrogen or the like as in the conventional soldering apparatus and since no clogging occur in the jet nozzle 3, it is capable of maintaining stable point soldering. Further, since the through hole 40 of the printed circuit board P is filled with the molten solder 4, it is possible to improve reliability as compared with the conventional apparatus.

It is to be noted that the point flow soldering apparatus 1 is exposed to the outside air only through the insert hole 19a of the nozzle cap 19 of the jet nozzle 3 so that the molten solder 4 at the part of insert hole 19a, which is exposed to the outside air, is oxidized to form a film-like oxide. The molten solder 4 excluding the insert hole 19a is intercepted from exposure to the outside air by the oxide occurred in the insert hole 19a so that it is not oxidized.

However, if the molten solder 4 is kept to a height corresponding to that of the forward end of the insert hole 19a of the nozzle cap 19 for a long time, the oxide occurred in the insert hole 19a becomes thicker so that there is a risk of failing in inserting the lead thereinto even when the lead of the electronic component 30 is pierced thereinto. Thus, if operation waiting time becomes elongated, it is preferable that the molten solder 4 in the cylinder 14 is discharged by bringing the stream in the cylinder 14 lowering.

It is to be noted that the point flow soldering apparatus 1 enables not only the discrete components but also electronic components such as a heat radiator and a case, and a screw to be soldered, so that by adjusting a size of the nozzle cap 19, it is possible to solder various kinds of components.

Description of Codes

1 . . . Point Flow Soldering Apparatus; 2 . . . Solder Bath; 3 . . . Jet Nozzle; 4 . . . Molten Solder; 5 . . . Duct; 5a, 5b, 18a, 18b . . . Openings; 6 . . . Platform; 7 . . . Screw Pump; 7a . . . Spiral Blades; 7b . . . Rotation Axis; 8 . . . Bearing; 9 . . . Bearing-Supporting Member; 10, 13 . . . Pulleys; 11 . . . Supporting Member; 12 . . . Motor; 14 . . . Cylinder; 14a . . . Flange Extending Outward; 15 . . . Inner Cylinder; 16 . . . Outer Cylinder; 17 . . . Nozzle Bottom Portion; 18c . . . Groove; 19 . . . Nozzle Cap; 19a . . . Insert Hole; 20 . . . Space; 21 . . . Outlet; 22 . . . Belt; and 30 . . . Electronic component.

The invention claimed is:

1. A point flow soldering apparatus for soldering lead of electronic component, the apparatus comprising a solder bath, and a jet nozzle which flows out the solder contained in the solder bath upward, the electronic component being positioned over the jet nozzle so as to be away from it by a predetermined distance, characterized in that the jet nozzle contains:

an outer cylinder which has openings at an end and the other end thereof along an axial direction, the opening at the end thereof being positioned inside the solder bath, the opening at the other end thereof being positioned outside the solder bath;

an inner cylinder which is installed inside the outer cylinder and has openings at an end and the other end thereof along the axial direction, the opening at the end thereof being positioned inside the solder bath, the opening at the other end thereof being positioned outside the solder bath; and a nozzle cap which has an insert hole for allowing the lead to be inserted and completely covers the openings at the other ends of the inner and outer cylinders, such that said openings at the other ends are exposed to air via only a part of the insert hole, wherein the solder contained in the solder bath is flown from inside of the inner cylinder to the nozzle cap to fill the nozzle cap with the solder up to the top of the insert hole, the solder filling the nozzle cap up to the top of the insert hole solders the lead inserted into the insert hole, and the solder is then flown downward from between the inner and outer cylinders.

2. The point flow soldering apparatus according to claim 1, characterized in that a distance between an inner side surface of the outer cylinder and an outer side surface of the inner cylinder is 1.2 times not less than and 5 times not more than a distance between a forward end of the nozzle cap and the electronic component to be soldered.

3. The point flow soldering apparatus according to claim 1, characterized in that a distance between an inner side surface of the outer cylinder and an outer side surface of the inner cylinder is not less than 0.1 mm and not more than 2.0 mm.

4. The point flow soldering apparatus according to claim 1, characterized in that a screw pump which dispatches the solder is provided in the solder bath.

5. The point flow soldering apparatus according to claim 1, characterized in that a flange is provided at an end of the inner cylinder, and the flange is provided with a groove for allowing an end of the outer cylinder to be fitted thereto.

* * * * *